(12) United States Patent
Franklin et al.

(10) Patent No.: US 12,354,847 B2
(45) Date of Patent: Jul. 8, 2025

(54) METHODS AND APPARATUS FOR CONDUCTANCE LINERS IN SEMICONDUCTOR PROCESS CHAMBERS

(71) Applicant: APPLIED MATERIALS, INC., Santa Clara, CA (US)

(72) Inventors: Timothy Joseph Franklin, Campbell, CA (US); Rajinder Dhindsa, Pleasanton, CA (US); Daniel Sang Byun, Campbell, CA (US); Carlaton Wong, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 111 days.

(21) Appl. No.: 16/816,672

(22) Filed: Mar. 12, 2020

(65) Prior Publication Data
US 2021/0285101 A1    Sep. 16, 2021

(51) Int. Cl.
| | | |
|---|---|---|
| *H01J 37/32* | (2006.01) | |
| *C23C 16/44* | (2006.01) | |
| *C23C 16/458* | (2006.01) | |
| *C23C 16/505* | (2006.01) | |
| *H01L 21/67* | (2006.01) | |

(52) U.S. Cl.
CPC .... *H01J 37/32623* (2013.01); *C23C 16/4405* (2013.01); *C23C 16/4585* (2013.01); *H01J 37/32853* (2013.01); *C23C 16/505* (2013.01); *H01L 21/67069* (2013.01)

(58) Field of Classification Search
CPC ............... H01J 37/32091; H01J 37/321; H01J 37/32495; H01J 37/32477; H01J 37/32513; H01J 37/32623–32651; H01J 37/32853; C23C 16/4405; C23C 16/4585; C23C 16/505; H01L 21/67069; H01L 21/67196
See application file for complete search history.

(56) References Cited

U.S. PATENT DOCUMENTS

| | | | |
|---|---|---|---|
| 5,670,218 A | * | 9/1997 | Baek ................... C23C 16/4408 427/126.3 |
| 5,788,799 A | | 8/1998 | Steger et al. |

(Continued)

FOREIGN PATENT DOCUMENTS

| | | |
|---|---|---|
| JP | 2002025983 A | 1/2002 |
| JP | 2018195817 A | 12/2018 |

(Continued)

OTHER PUBLICATIONS

International Search Report and Written Opinion for PCT/US2021/013417 dated May 6, 2021.

*Primary Examiner* — Kurt Sweely
(74) *Attorney, Agent, or Firm* — Moser Taboada

(57) ABSTRACT

An apparatus for processing substrates that includes a process chamber with a process volume and a conductance liner surrounding the process volume wherein the conductance liner has at least one fixed portion and a movable portion. The movable portion is configured to expose a substrate transfer slot in a wall of the process chamber. The apparatus also includes a lifting assembly with an actuator attached to the movable portion of the conductance liner. The lifting assembly is configured to move the movable portion of the conductance liner in a vertical direction to expose the substrate transfer slot.

20 Claims, 7 Drawing Sheets

(56) References Cited

U.S. PATENT DOCUMENTS

| | | | | |
|---|---|---|---|---|
| 6,111,225 | A * | 8/2000 | Ohkase | H01L 21/67109 |
| | | | | 118/724 |
| 6,170,429 | B1 * | 1/2001 | Schoepp | H01J 37/32495 |
| | | | | 118/723 R |
| 6,652,713 | B2 * | 11/2003 | Brown | H01L 21/67069 |
| | | | | 118/728 |
| 6,872,281 | B1 * | 3/2005 | Chen | H01J 37/32871 |
| | | | | 156/345.43 |
| 7,270,715 | B2 * | 9/2007 | Dando | C23C 16/45519 |
| | | | | 156/345.31 |
| 7,530,359 | B2 * | 5/2009 | Numasawa | C23C 16/4405 |
| | | | | 134/22.12 |
| 8,349,085 | B2 * | 1/2013 | Tahara | C23C 16/4401 |
| | | | | 156/345.31 |
| 8,485,128 | B2 | 7/2013 | Kellogg et al. | |
| 8,847,495 | B2 | 9/2014 | de la Llera et al. | |
| 9,171,702 | B2 | 10/2015 | Kellogg et al. | |
| 2002/0043750 | A1 | 4/2002 | Lenz | |
| 2003/0134499 | A1 | 7/2003 | Chen et al. | |
| 2004/0011467 | A1 * | 1/2004 | Hemker | H01J 37/32495 |
| | | | | 156/345.49 |
| 2004/0149214 | A1 * | 8/2004 | Hirose | H01L 21/67126 |
| | | | | 118/715 |
| 2004/0159286 | A1 * | 8/2004 | Aoki | H01J 37/32633 |
| | | | | 118/723 E |
| 2006/0032586 | A1 * | 2/2006 | Choi | H01J 37/32715 |
| | | | | 156/345.51 |
| 2006/0060302 | A1 * | 3/2006 | White | H01J 37/32082 |
| | | | | 118/723 R |
| 2011/0287632 | A1 | 11/2011 | Brown et al. | |
| 2014/0060739 | A1 | 3/2014 | Dhindsa et al. | |
| 2015/0060404 | A1 * | 3/2015 | Dhindsa | H01J 37/32633 |
| | | | | 216/61 |
| 2017/0256435 | A1 * | 9/2017 | Joubert | H01L 21/68735 |
| 2019/0360100 | A1 | 11/2019 | Nguyen et al. | |

FOREIGN PATENT DOCUMENTS

| | | |
|---|---|---|
| KR | 10-2020-0009220 A | 1/2020 |
| WO | WO 20000795972 A1 | 6/2000 |

* cited by examiner

METHODS AND APPARATUS FOR CONDUCTANCE LINERS IN SEMICONDUCTOR PROCESS CHAMBERS

FIELD

Embodiments of the present principles generally relate to conductance liners used in semiconductor chambers for manufacturing semiconductor devices.

BACKGROUND

Deposition and etch chambers used in the manufacturing of semiconductor devices need to produce consistent and uniform results for every substrate that is processed. To further enhance processing, plasma can be used in both deposition and etching of materials. The plasma can be generated through inductive coupling or capacitive coupling. In capacitively coupled plasma chambers, conductance liners are used to contain the plasma generated in a process volume of the chamber and to provide an RF ground return path. The conductance liners generally surround the process volume except where interrupted by substrate transfer slots. The substrate transfer slots allow robotic arms to place substrates into and out of the process volume of the plasma chamber. The inventors have observed, however, that the presence of the transfer slot interferes with the uniformity of the deposition on the substrate during processing.

Thus, the inventors have provided improved methods and apparatus that increase deposition uniformity on substrates.

SUMMARY

Methods and apparatus for increasing deposition uniformity on substrates are provided herein.

In some embodiments, an apparatus for processing substrates may comprise a process chamber with a process volume, a conductance liner surrounding the process volume, the conductance liner having at least one fixed portion and a movable portion, the movable portion configured to expose a substrate transfer slot in a wall of the process chamber, and a lifting assembly with an actuator attached to the movable portion of the conductance liner, the lifting assembly configured to move the movable portion of the conductance liner in a vertical direction.

In some embodiments, the apparatus may further comprise wherein the at least one fixed portion of the conductance liner has a first horizontal portion at a top of the process chamber and the movable portion of the conductance liner has a vertical portion and a second horizontal portion, the vertical portion configured to interact with the fixed portion when the movable portion is raised and the second horizontal portion configured to interact with an edge ring when the movable portion is raised to complete an RF ground return path within the process chamber; wherein the vertical portion has a first recess in a top end with a first RF gasket in the first recess and the second horizontal portion has a second recess in a top surface of an end distal to the vertical portion with a second RF gasket in the second recess; wherein the at least one fixed portion of the conductance liner has a first horizontal portion at a top of the process chamber and a second horizontal portion electrically interacting with an edge ring and the movable portion of the conductance liner is a vertical portion, the vertical portion configured to electrically interact with the first horizontal portion and the second horizontal portion when the movable portion is raised to complete an RF ground return path within the process chamber; wherein the vertical portion has a first recess in a top end with a first RF gasket in the first recess and a second recess in a side surface at a bottom end with a second RF gasket in the second recess; wherein the at least one fixed portion of the conductance liner has a first horizontal portion at a top of the process chamber and a first vertical portion and the movable portion of the conductance liner has a second vertical portion and a second horizontal portion, the second vertical portion configured to interact with the first vertical portion when the movable portion is raised and the second horizontal portion configured to interact with an edge ring when the movable portion is raised to complete an RF ground return path within the process chamber; wherein the second vertical portion has a first recess in a top end with a first RF gasket in the first recess and the second horizontal portion has a second recess in a top surface of an end distal to the second vertical portion with a second RF gasket in the second recess; wherein the actuator has at least a portion that is non-conductive and configured to electrically isolate the movable portion of the conductance liner; wherein the lifting assembly utilizes a linear motorized drive to vertically move the actuator or a pneumatic drive to vertically move the actuator; and/or wherein at least a portion of the conductance liner is polysilicon, silicon, silicon carbide, single crystal silicon, or silicon carbide coated aluminum.

In some embodiments, an apparatus for processing substrates may comprise a conductance liner configured to surround a process volume in a process chamber to confine plasma and provide an RF ground return path, the conductance liner having at least one first portion configured to be fixed in the process chamber and a second portion configured to be movable within the process chamber in a vertical direction to expose a substrate transfer slot in a wall of the process chamber, the second portion configured to provide a portion of the RF ground return path when in a raised position and electrically interacting with the at least one first portion.

In some embodiments, the apparatus may further comprise wherein the at least one first portion has a first horizontal portion and the second portion has a vertical portion and a second horizontal portion, the vertical portion configured to interact with the first portion when the second portion is raised and the second horizontal portion configured to interact with a ground when the second portion is raised to complete the RF ground return path within the process chamber; wherein the vertical portion has a first recess in a top end with a first RF gasket in the first recess and the second horizontal portion has a second recess in a top surface of an end distal to the vertical portion with a second RF gasket in the second recess; wherein the first RF gasket or the second RF gasket is stainless steel; wherein the at least one first portion has a first horizontal portion and a separated second horizontal portion and the second portion of has a vertical portion, the vertical portion configured to electrically interact with the first horizontal portion and the second horizontal portion when the second portion is raised to complete the RF ground return path within the process chamber; wherein the vertical portion has a first recess in a top end with a first RF gasket in the first recess and a second recess in a side surface at a bottom end with a second RF gasket in the second recess; wherein the at least one first portion has a first horizontal portion connected to a first vertical portion and the second portion has a second vertical portion connected to a second horizontal portion, the second vertical portion configured to interact with the first vertical portion when the second portion is raised and the second horizontal portion configured to interact with a ground when the second portion is raised to complete the RF ground return path within the process chamber; wherein the second vertical portion has a first recess in a top end with a first RF gasket in the first recess and the second horizontal portion has a second recess in a top surface of an end distal to the second vertical portion with a second RF gasket in the second recess, and/or wherein at least a portion of the conductance liner is polysilicon, silicon, silicon carbide, single crystal silicon, or silicon carbide coated aluminum.

In some embodiments, a method of cleaning a process chamber may comprise lowering a movable portion of a conductance liner to break electrical contact with at least one non-movable portion of the conductance liner or a substrate support assembly, generating plasma in a process volume of the process chamber without an RF ground return path, and heating the conductance liner with plasma to remove depositions.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
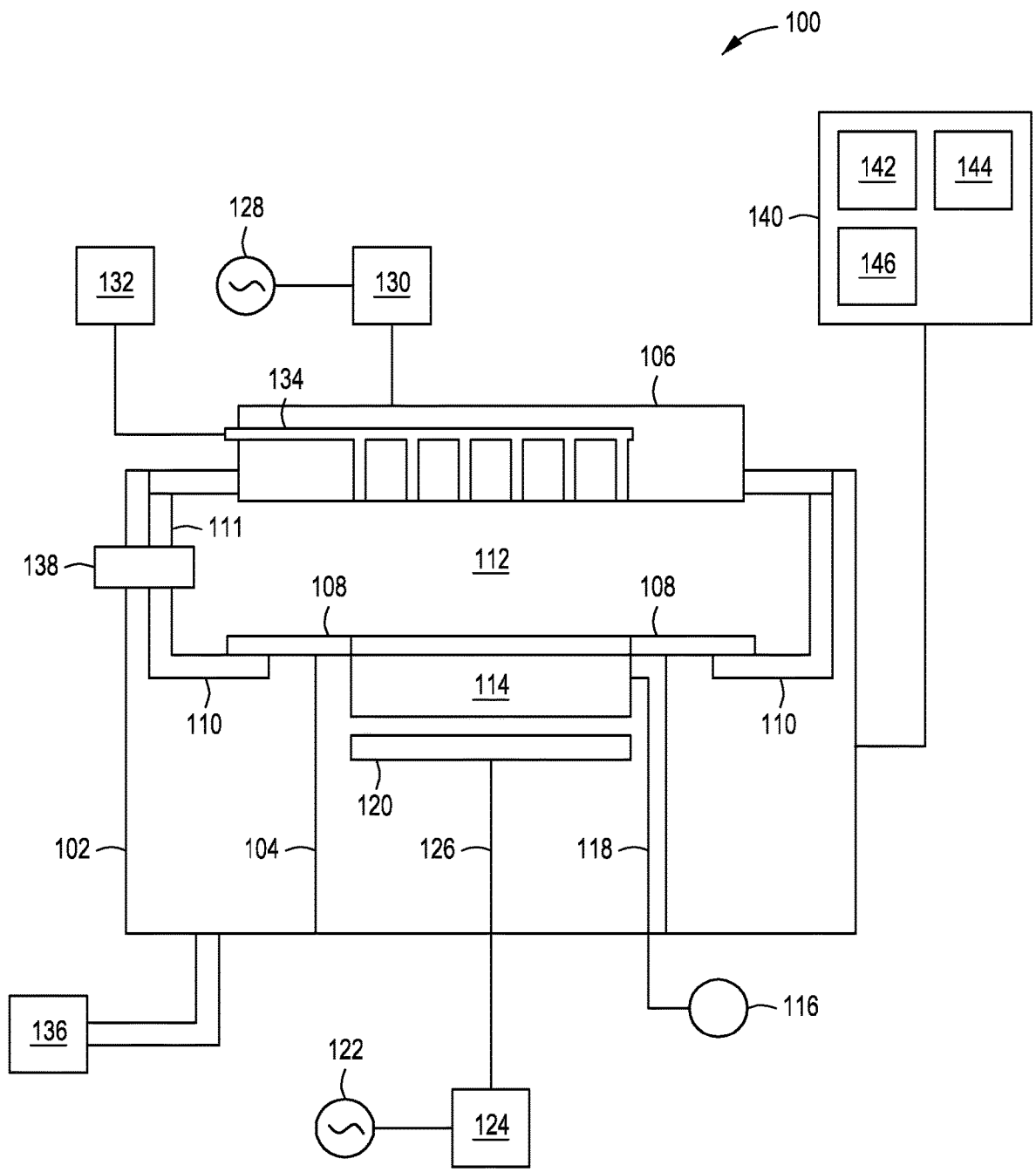
FIG. 1 depicts a cross-sectional view of a process chamber for semiconductor processing in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide improved deposition uniformity in plasma process chambers. Plasma confinement liners or conductance liners facilitate in keeping the plasma within a process chamber's process volume and provide an RF ground return path during processing. The inventor has found that any disruption with the RF ground return path in the conductance liner causes uniformity issues during deposition. The inventor discovered that substrate transfer slots used for placing substrates into and out of the process volume of the process chamber are a major source of uniformity issues as the substrate transfer slot breaches the conductance liner. The substrate transfer slot disrupts the smoothness of the inner surface of the conductance liner and affects the current flow through the conductance liner. For plasma to be generated evenly and consistently, the process volume should provide a conductance liner with a smooth, even inner surface and with a uniform thickness to provide a uniform current path for the RF return. The methods and apparatus of the present principles provide a 360-degree conductance liner that provides both a smooth uninterrupted inner surface and an even thickness on all vertical walls to further enhance deposition uniformity.

The methods and apparatus of the present principles can be applied to, for example, capacitively coupled plasma chambers such as that illustrated in FIG. 1. FIG. 1 shows a cross-sectional view 100 of a process chamber 102 that includes a substrate support assembly 104 and an upper electrode 106. An edge ring 108 interfaces with a conductance liner 110 and the substrate support assembly 104. The upper electrode 106, the conductance liner 110, and the edge ring 108 help to define a process volume 112. The substrate support assembly 104 includes an electrostatic chuck (ESC) assembly 114 that is electrically connected via a first conductor 118 to a DC power supply 116. The DC power supply 116 provides DC voltage to the ESC assembly 114 to electrostatically clamp substrates to the substrate support assembly 104. The substrate support assembly 104 also includes a lower electrode 120 that is electrically connected via a second conductor 126 to an RF bias power supply 122 via an RF bias matching network 124. The upper electrode 106 is electrically connected to an RF power supply 128 via an RF matching network 130. The upper electrode 106 may also include gas passages 134 that are fluidly connected to a gas supply 132. A vacuum pump 136 assists in removing byproducts and/or gases from the process chamber 102.

A controller 140 controls the operation of the process chamber 102 using a direct control or indirect control via other computers (or controllers) associated with the process chamber 102. In operation, the controller 140 enables data collection and feedback from the process chamber 102 and peripheral systems to optimize performance of the process chamber 102. The controller 140 generally includes a Central Processing Unit (CPU) 142, a memory 144, and a support circuit 146. The CPU 142 may be any form of a general-purpose computer processor that can be used in an industrial setting. The support circuit 146 is conventionally coupled to the CPU 142 and may comprise a cache, clock circuits, input/output subsystems, power supplies, and the like. Software routines, such as a method as described below may be stored in the memory 144 and, when executed by the CPU 142, transform the CPU 142 into a specific purpose computer (controller 140). The software routines may also be stored and/or executed by a second controller (not shown) that is located remotely from the process chamber 102.

The memory 144 is in the form of computer-readable storage media that contains instructions, when executed by the CPU 142, to facilitate the operation of the semiconductor processes and equipment. The instructions in the memory 144 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
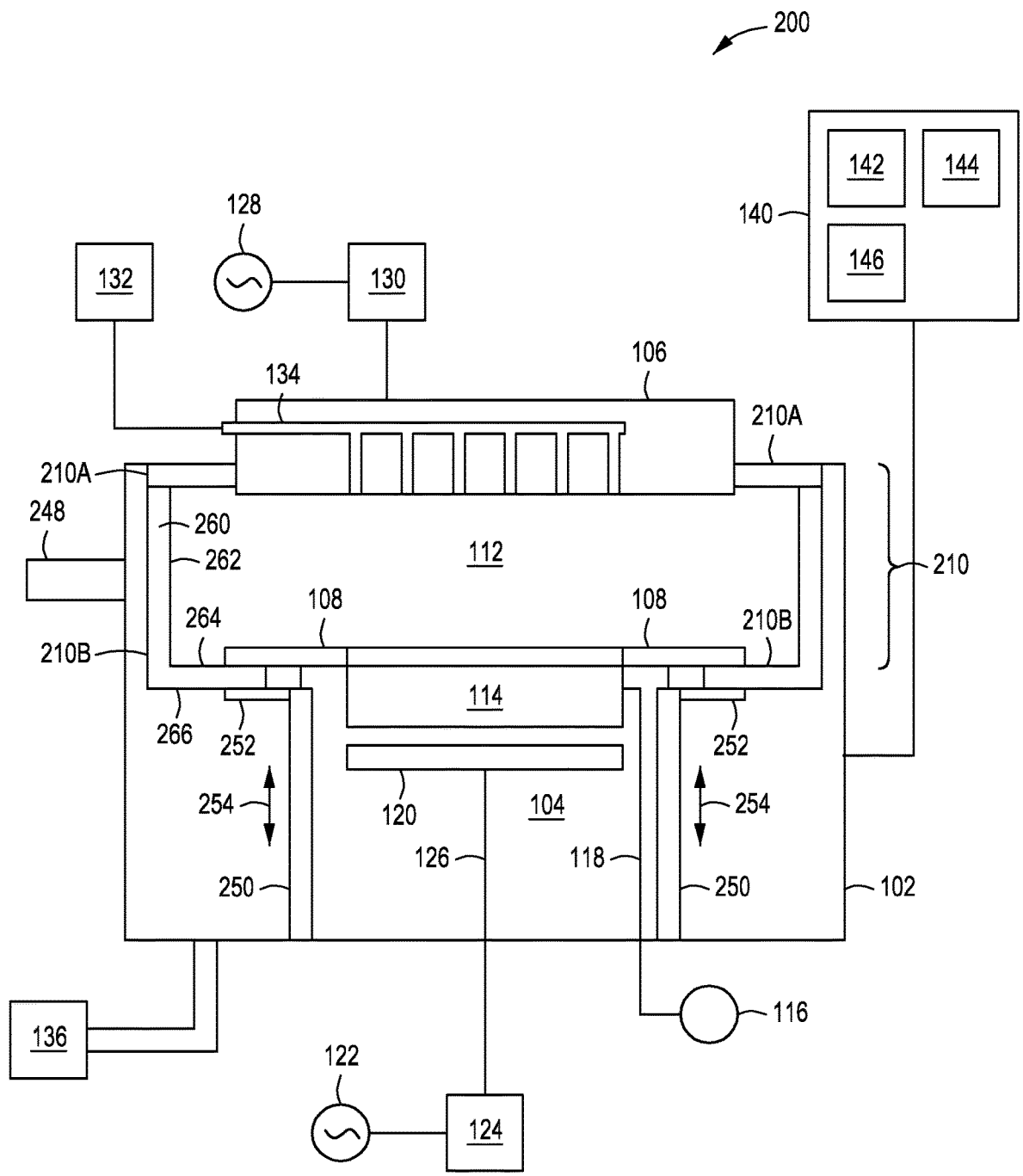
FIG. 2 depicts a cross-sectional view of a process chamber with a movable conductance liner in accordance with some embodiments of the present principles.
Figure 9:
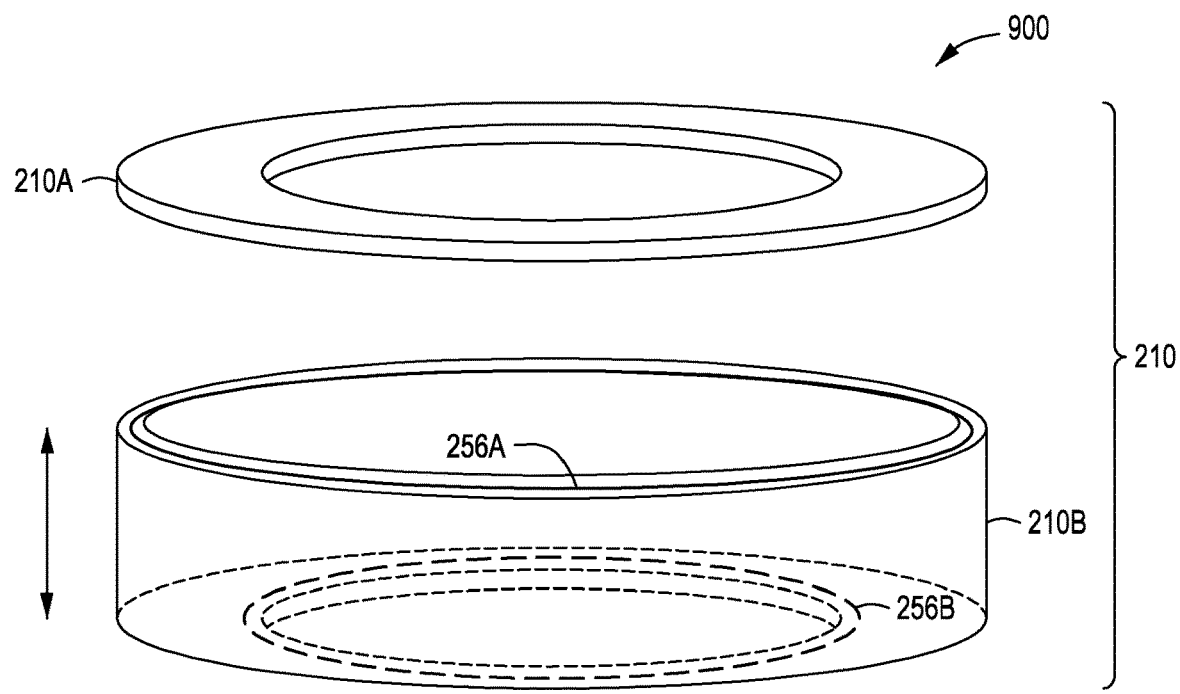
FIG. 9 depicts an isometric view of a two-piece movable conductance liner in accordance with some embodiments of the present principles.

In the example of FIG. 1, a substrate transfer slot 138 breaches the conductance liner 110, disrupting an inner surface 111 and conductivity of the conductance liner, causing deposition uniformity issues. In the cross-sectional view 200 of FIG. 2, the breach has been removed and the conductance liner 110 of FIG. 1 has been replaced with a movable conductance liner 210 having a fixed portion 210A and a movable portion 210B. A substrate transfer slot 248 has been relocated to an outer wall 103 of the process chamber 102 and no longer breaches the movable conductance liner 210. In some embodiments, the fixed portion 210A of the movable conductance liner 210 is an annular shaped flat ring (see view 900 of FIG. 9, 210A) that surrounds the upper electrode 106. In some embodiments, the movable portion 210B of the movable conductance liner 210 is annular with an L-shaped profile (see FIG. 4, 410B and view 900 of FIG. 9, 210B) that surrounds the substrate support assembly 104. The movable portion 210B makes electrical contact with the fixed portion 210A at an upper end 260 of a vertical portion 262 of the movable portion 210B. The movable portion 210B makes electrical contact with the edge ring 109 on an upper surface 264 of a horizontal portion 266 of the movable portion 210B. The movable portion 210B is attached to an actuator 252 that is driven by a lift assembly 250. At least a portion of the movable conductance liner 210 may be formed from a material such as single crystal silicon, polysilicon, silicon carbide, a combination of silicon and silicon carbide, silicon carbide coated aluminum, or the like. The lift assembly 250 and actuator 252 provide vertical movement 254 to the movable portion 210B. The lift assembly 250 may be operated by a motor or by a pneumatically driven piston assembly (not shown). In some embodiments, more than one actuator 252 and lift assembly 250 may be used to provide vertical motion to the movable portion 210B. The lift assembly 250 may be incorporated into the substrate support assembly 104 and/or maybe incorporated independent of the substrate support assembly 104. In some embodiments, the actuator 252 may provide electrical isolation between the movable portion 210B and the substrate support assembly 104.

Figure 3:
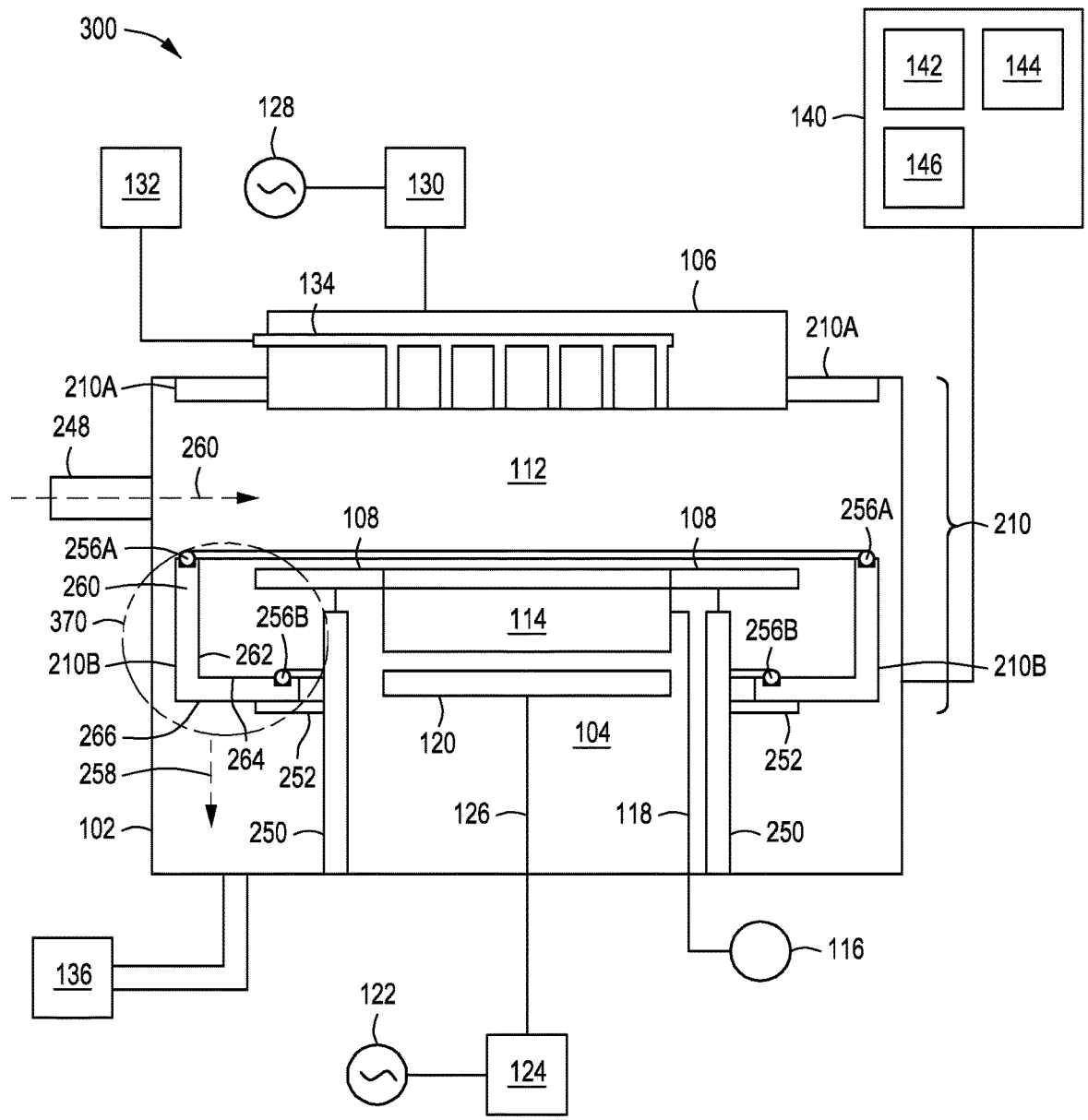
FIG. 3 depicts a cross-sectional view of a process chamber with a movable conductance liner in a lowered position in accordance with some embodiments of the present principles.
Figure 4:
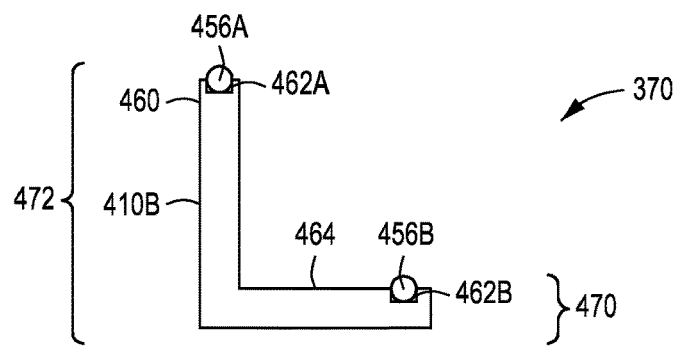
FIG. 4 depicts a cross-sectional view of a movable portion in accordance with some embodiments of the present principles.

FIG. 3 is a cross-sectional view 300 of the process chamber 102 with the movable conductance liner 210 in a lowered position 258. In some embodiments, the movable portion 210B of the movable conductance liner 210 may have one or more RF gaskets 256A, 256B to improve electrical contact with the fixed portion 210A and/or the edge ring 108. The RF gaskets 256A, 256B may be o-rings made from a stainless-steel material which is compressible to form a tight electrical contact around the entire perimeters of the movable portion 210B. When the movable portion 210B is in the lowered position 258, the substrate transfer slot is available to allow a substrate to be placed into 260 the process chamber 102. After placement of the substrate on the substrate support assembly 104, the lift assembly 250 and actuator 252 move the movable portion 210B upward until the RF gaskets 256A, 256B compress against the fixed portion 210A and the edge ring 108. The controller 140 may control the process and/or receive feedback to know when the movable portion 210B has been lowered and/or when the movable portion 210B is in the up position. FIG. 4 depicts a cross-sectional view 370 of a movable portion 410B in accordance with some embodiments. The movable portion 410B has a first recess 462A in an upper end 460 of a vertical portion 472 for a first RF gasket 456A and a second recess 462B in an upper surface 464 of a horizontal portion 470 for a second RF gasket 456B.

Figure 5:
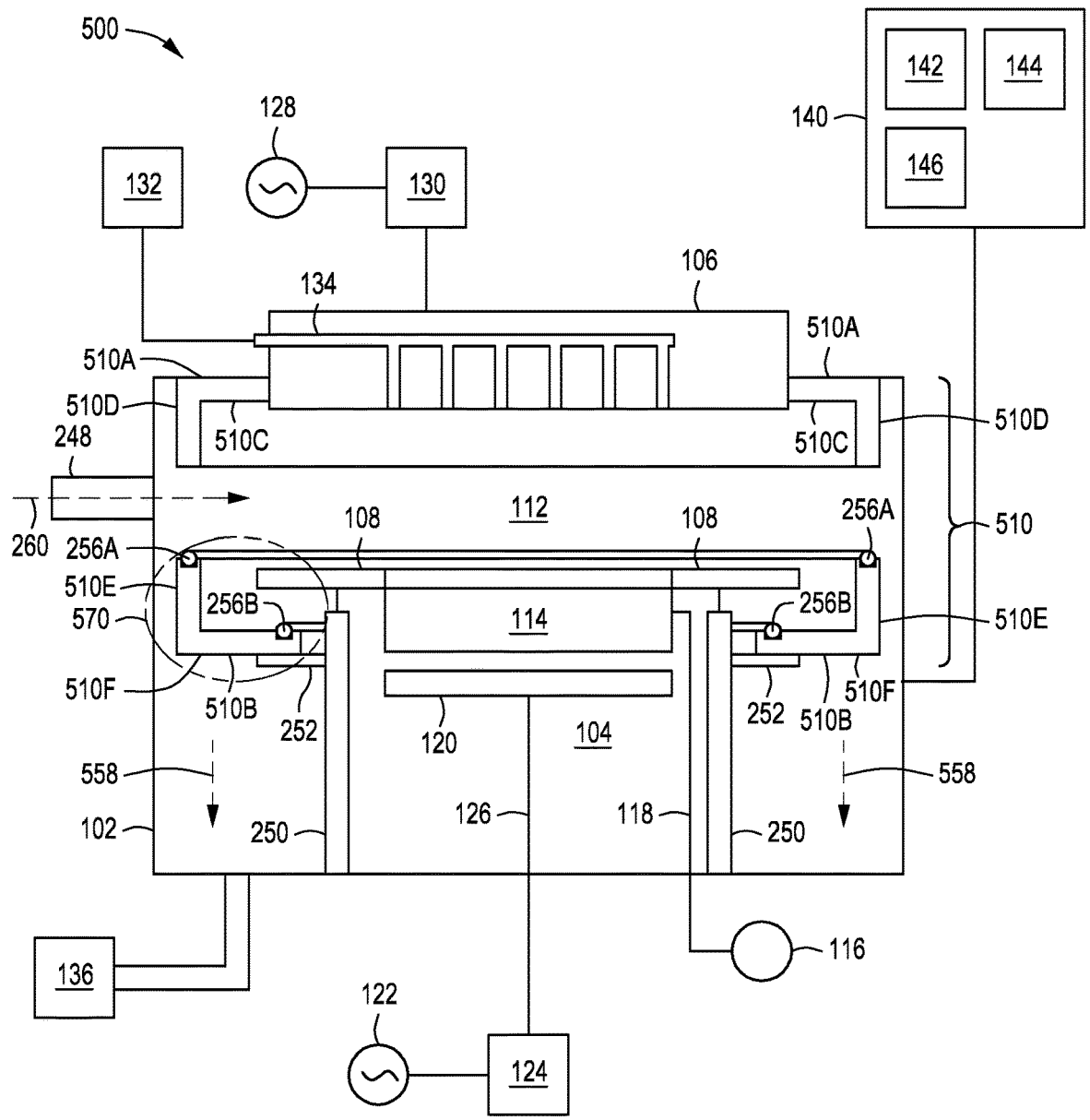
FIG. 5 depicts a cross-sectional view of a process chamber with a movable conductance liner with a split vertical sidewall in accordance with some embodiments of the present principles.
Figure 6:
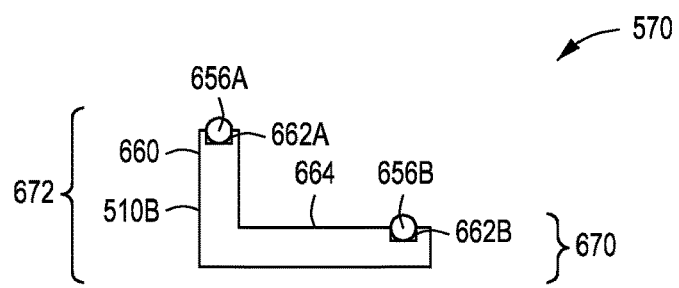
FIG. 6 depicts a cross-sectional view of a movable portion with a split vertical sidewall in accordance with some embodiments of the present principles.
Figure 10:
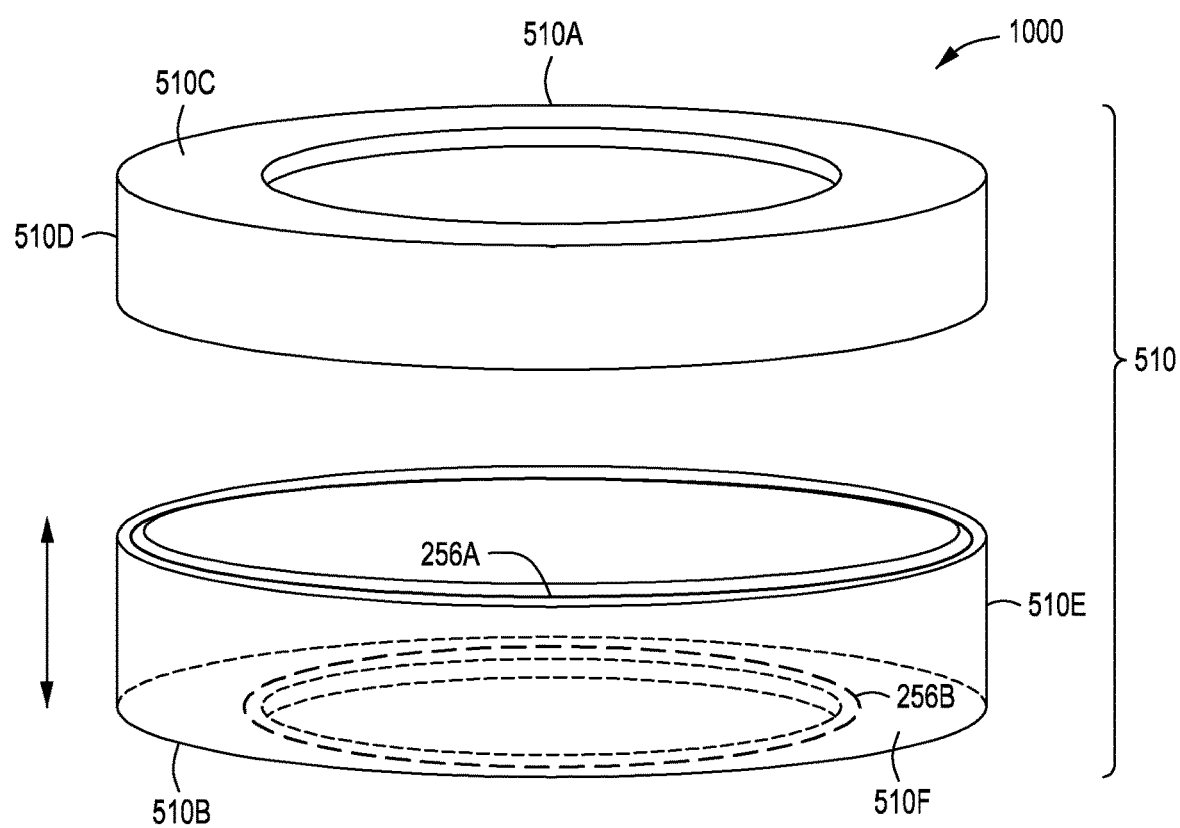
FIG. 10 depicts an isometric view of a split vertical sidewall movable conductance liner in accordance with some embodiments of the present principles.

FIG. 5 depicts a cross-sectional view 500 of the process chamber 102 with a movable conductance liner 510 with a split vertical sidewall in accordance with some embodiments. A fixed portion 510A of the movable conductance liner 510 has a first horizontal portion 510C and a first vertical portion 510D, creating an L-shaped profile (see view 1000 of FIG. 10, 510C, 510D). The movable portion 510B has a second horizontal portion 510F and a second vertical portion 510E, creating an L-shaped profile (see FIG. 10, 510E, 510F). The first vertical portion 510D of the fixed portion 510A and the second vertical portion 510E may or may not have the same height. When the movable portion 510B is in the lowered position 558, a substrate may be placed or removed from the substrate support assembly 104. At least a portion of the movable conductance liner 510 may be formed from a material such as single crystal silicon, polysilicon, silicon carbide, a combination of silicon and silicon carbide, silicon carbide coated aluminum, or the like. FIG. 6 depicts a cross-sectional view 570 of the movable portion 510B in accordance with some embodiments. The movable portion 510B has a first recess 662A in an upper end 660 of a vertical portion 672 for a first RF gasket 656A and a second recess 662B in an upper surface 664 of a horizontal portion 670 for a second RF gasket 656B.

Figure 7:
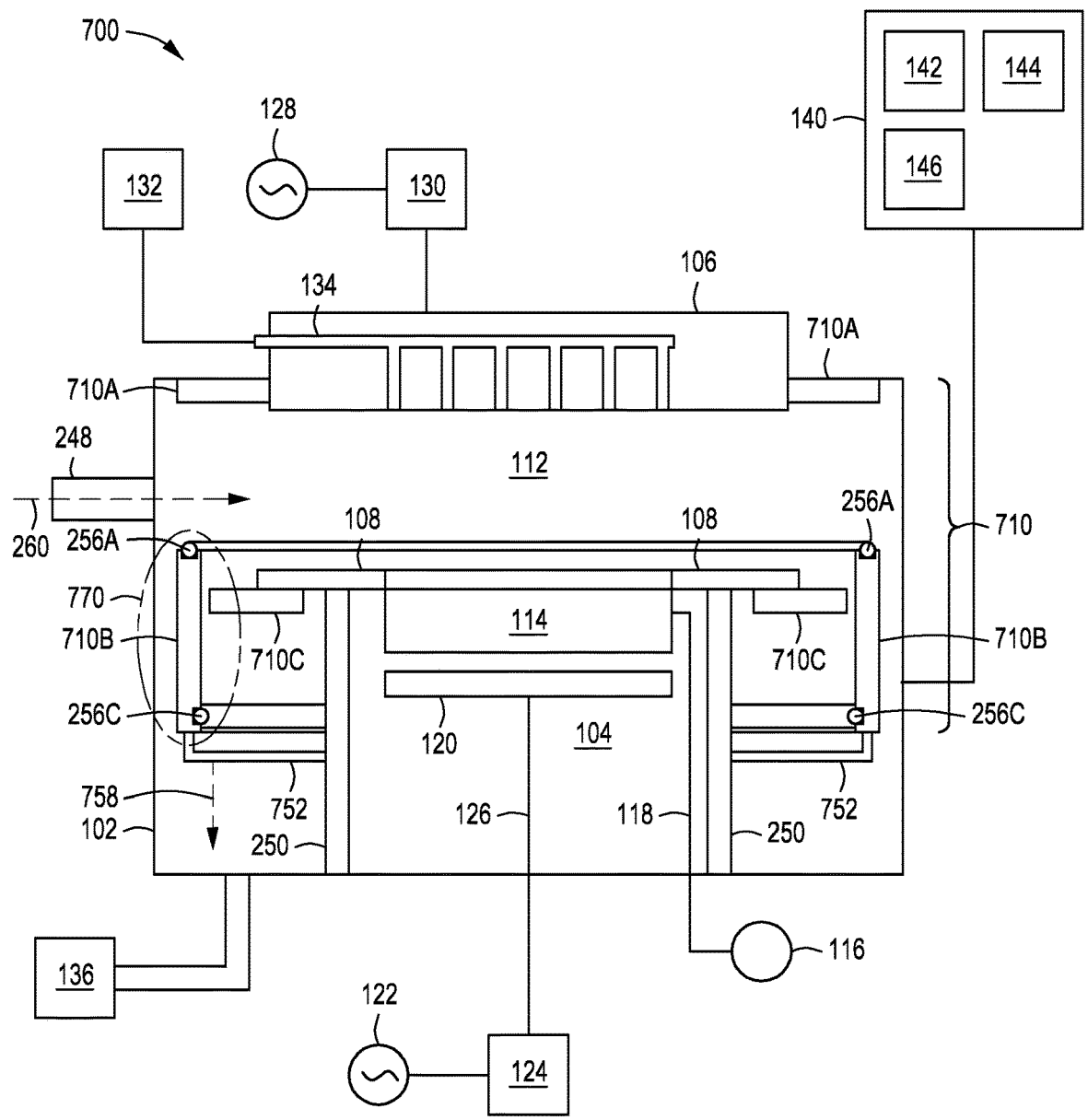
FIG. 7 depicts a cross-sectional view of a process chamber with a movable conductance liner with a movable vertical sidewall in accordance with some embodiments of the present principles.
Figure 8:
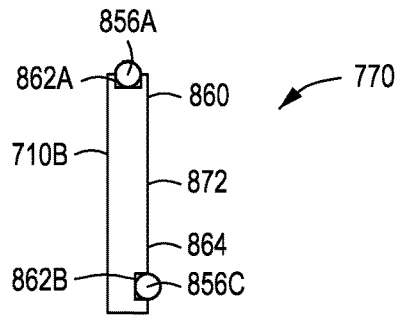
FIG. 8 depicts a cross-sectional view of a movable portion in accordance with some embodiments of the present principles.
Figure 11:
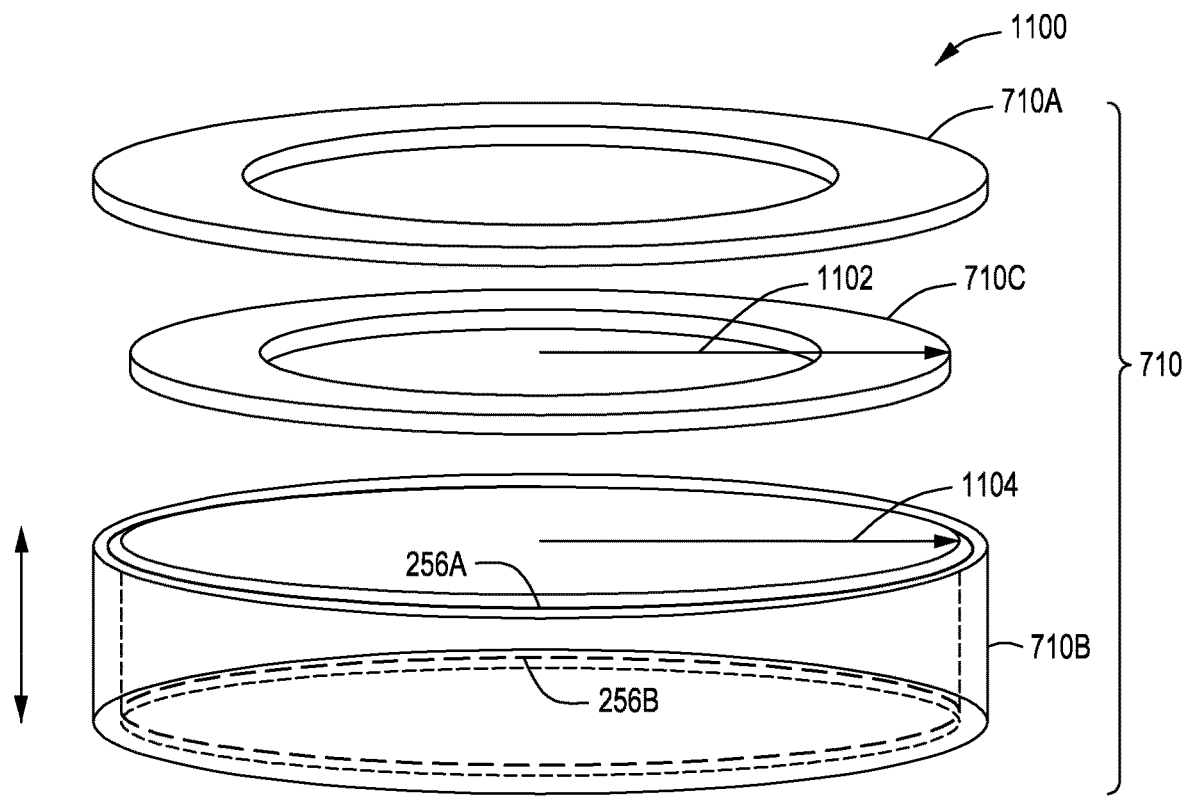
FIG. 11 depicts an isometric view of a three-piece movable conductance liner in accordance with some embodiments of the present principles.

FIG. 7 depicts a cross-sectional view 700 of the process chamber 102 with a movable conductance liner 710 with a movable portion 710B in accordance with some embodiments. In some embodiments, the movable conductance liner 710 has more than one fixed portion, namely a first fixed portion 710A and a second fixed portion 710C (see FIG. 11, 710A, 710C). An actuator 752 from the lift assembly 250 is attached to the movable portion 710B. When the movable portion 710B is in the lowered position 758, a substrate may be placed or remove from the substrate support assembly 104. At least a portion of the movable conductance liner 710 may be formed from a material such as single crystal silicon, polysilicon, silicon carbide, a combination of silicon and silicon carbide, silicon carbide coated aluminum, or the like. As shown in a view 1100 in FIG. 11, an inner diameter 1104 of the movable portion 710B is greater than an outer diameter 1102 of the second fixed portion 710C. The difference in diameters allows the movable portion 710B to move past the second fixed portion 710C untouched, making contact with the second RF gasket 256B when in a raised position. FIG. 8 depicts a cross-sectional view 770 of the movable portion 710B in accordance with some embodiments. The movable portion 710B has a first recess 862A in an upper end 860 of a vertical portion 872 for a first RF gasket 856A and a second recess 862B in a sidewall 864 of the vertical portion 872 for a second RF gasket 856B.

Figure 12:
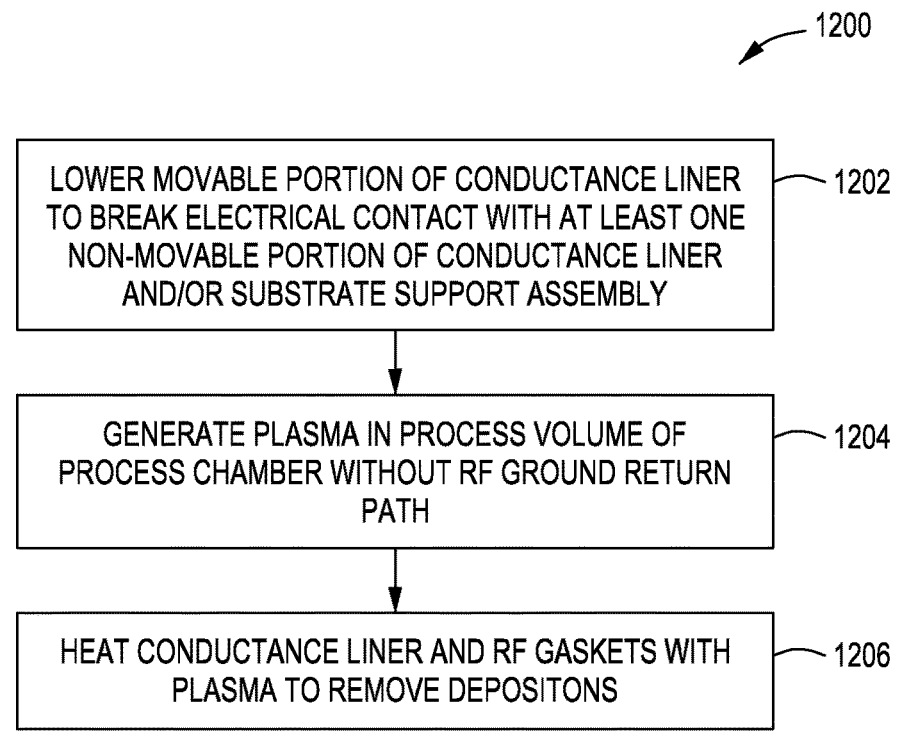
FIG. 12 is a method of cleaning a process chamber with a movable conductance liner in accordance with some embodiments of the present principles.

The apparatus described above may also be utilized during cleaning of a process chamber. FIG. 12 is a method 1200 of cleaning a process chamber with a conductance liner in accordance with some embodiments. An additional benefit of having a movable conductance liner is that the movable conductance liner can be moved to break the RF ground return path. At least a portion of the movable conductance liner may be formed from a material such as single crystal silicon, polysilicon, silicon carbide, a combination of silicon and silicon carbide, silicon carbide coated aluminum, or the like. In block 1202, a movable portion of a conductance liner is lowered to break the electrical contact with at least one non-movable portion of the conductance liner and/or a substrate support assembly. In block 1204, plasma is generated in a process volume of the process chamber without an RF ground return path. In block 1206, the conductance liner is heated with the plasma to remove depositions. In some embodiments with RF gaskets, the RF gaskets are cleaned along with the conductance liner during the cleaning process. The cleaning process facilitates in extending the life of the parts and also in maintaining deposition uniformities.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for processing substrates, comprising:
a process chamber with a process volume and an upper electrode positioned in a top of the process chamber;
a conductance liner surrounding the process volume that is configured to confine plasma and configured to provide an RF ground return path, the conductance liner having at least one fixed portion that is completely annular in a plan view and a movable portion that is completely annular in a plan view, the movable portion configured to expose a substrate transfer slot in a wall of the process chamber, wherein the at least one fixed portion has a first vertical portion with a top interconnecting with a first horizontal portion at a top of the process chamber, wherein the first horizontal portion extends inward of an innermost vertical surface of the first vertical portion towards an outermost edge of the upper electrode, forming an annular ring, and wherein an innermost edge of the first horizontal portion is directly adjacent to the outermost edge of the upper electrode; and
a lifting assembly with an actuator attached to the movable portion of the conductance liner, the lifting assembly configured to move the movable portion of the conductance liner in a vertical direction.

2. The apparatus of claim 1, wherein the movable portion of the conductance liner has a second vertical portion and a second horizontal portion, the second vertical portion configured to interact with the first vertical portion of the fixed portion when the movable portion is raised and the second horizontal portion configured to interact with an edge ring when the movable portion is raised to complete the RF ground return path within the process chamber.

3. The apparatus of claim 2, wherein the second vertical portion has a first recess in a top end with a first RF gasket in the first recess and the second horizontal portion has a second recess in a top surface of an end distal to the second vertical portion with a second RF gasket in the second recess.

4. The apparatus of claim 1, wherein a second horizontal portion electrically interacting with an edge ring and the movable portion of the conductance liner is a vertical portion, the vertical portion configured to electrically interact with the first horizontal portion and the second horizontal portion when the movable portion is raised to complete an RF ground return path within the process chamber.

5. The apparatus of claim 4, wherein the vertical portion has a first recess in a top end with a first RF gasket in the first recess and a second recess in a side surface at a bottom end with a second RF gasket in the second recess.

6. The apparatus of claim 1, wherein the movable portion of the conductance liner has a second vertical portion and a second horizontal portion, wherein the second vertical portion is configured to interact with the first vertical portion when the movable portion is raised, and wherein the first vertical portion has a first vertical height and the second vertical portion has a second vertical height which is different from the first vertical height.

7. The apparatus of claim 1, wherein the movable portion of the conductance liner has a second vertical portion and a second horizontal portion, wherein the second vertical portion is configured to interact with the first vertical portion when the movable portion is raised, and wherein the first vertical portion has a first vertical height and the second vertical portion has a second vertical height which is approximately identical to the first vertical height.

8. The apparatus of claim 1, wherein the actuator has at least a portion that is non-conductive and configured to electrically isolate the movable portion of the conductance liner.

9. The apparatus of claim 1, wherein the lifting assembly utilizes a linear motorized drive to vertically move the actuator or a pneumatic drive to vertically move the actuator.

10. The apparatus of claim 1, wherein at least a portion of the conductance liner is polysilicon, silicon, silicon carbide, single crystal silicon, or silicon carbide coated aluminum.

11. An apparatus for processing substrates, comprising:
a conductance liner configured to surround a process volume in a process chamber to confine plasma and configured to provide an RF ground return path, the conductance liner having:
  at least one first portion configured to be fixed in the process chamber, wherein the at least one first portion is completely annular in a plan view, wherein the at least one first portion has a first vertical portion with a top interconnecting with a first horizontal portion at a top of the at least one first portion, wherein the first horizontal portion extends inward of an innermost vertical surface of the first vertical portion forming an annular ring, and wherein the first horizontal portion is configured to be positioned in a process chamber directly adjacent to a top of the process chamber and surrounding an outermost edge of an upper electrode with an innermost edge of the first horizontal portion directly adjacent to the outermost edge of the upper electrode; and
  a second portion configured to be movable within the process chamber in a vertical direction to expose a substrate transfer slot in a wall of the process chamber, the second portion configured to provide a portion of the RF ground return path when in a raised position and electrically interacting with the at least one first portion, wherein the second portion is completely annular in a plan view.

12. The apparatus of claim 11, wherein the second portion has a second vertical portion and a second horizontal portion, the second vertical portion configured to interact with the first vertical portion of the first portion when the second portion is raised and the second horizontal portion configured to interact with a ground when the second portion is raised to complete the RF ground return path within the process chamber.

13. The apparatus of claim 12, wherein the second vertical portion has a first recess in a top end with a first RF gasket in the first recess and the second horizontal portion has a second recess in a top surface of an end distal to the second vertical portion with a second RF gasket in the second recess.

14. The apparatus of claim 13, wherein the first RF gasket or the second RF gasket is stainless steel.

15. The apparatus of claim 11, wherein the at least one first portion has a separated second horizontal portion and the second portion of has a vertical portion, the vertical portion configured to electrically interact with the first horizontal portion and the separated second horizontal portion when the second portion is raised to complete the RF ground return path within the process chamber.

16. The apparatus of claim 15, wherein the vertical portion has a first recess in a top end with a first RF gasket in the first recess and a second recess in a side surface at a bottom end with a second RF gasket in the second recess.

17. The apparatus of claim 11, wherein the second portion has a second vertical portion connected to a second horizontal portion, wherein the second vertical portion is configured to interact with the first vertical portion when the second portion is raised, and wherein the first vertical portion has a first vertical height and the second vertical portion has a second vertical height which is different from the first vertical height.

18. The apparatus of claim 11, further comprising:
a controller configured to clean the apparatus by:
  lowering the second portion of the conductance liner to break electrical contact with the at least one first portion of the conductance liner or a substrate support assembly, wherein the second portion is completely annular in a plan view;
  generating plasma in the process volume of the process chamber without an RF ground return path; and
  heating the conductance liner with plasma to remove depositions.

19. The apparatus of claim 11, wherein at least a portion of the conductance liner is polysilicon, silicon, silicon carbide, single crystal silicon, or silicon carbide coated aluminum.

20. The apparatus of claim 1, further comprising:
a controller configured to clean the apparatus by:
  lowering the movable portion of the conductance liner to break electrical contact with the at least one fixed portion of the conductance liner or a substrate support assembly, wherein the movable portion is completely annular in a plan view;
  generating plasma in the process volume of the process chamber without an RF ground return path; and
  heating the conductance liner with plasma to remove depositions.

* * * * *